United States Patent
Chen

(10) Patent No.: US 10,269,945 B2
(45) Date of Patent: Apr. 23, 2019

(54) POWER TRANSISTOR DEVICE

(71) Applicant: UBIQ Semiconductor Corp., Hsinchu County (TW)

(72) Inventor: Chin-Fu Chen, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 4 days.

(21) Appl. No.: 15/873,910

(22) Filed: Jan. 18, 2018

(65) Prior Publication Data
US 2018/0358455 A1    Dec. 13, 2018

(30) Foreign Application Priority Data

Jun. 8, 2017  (TW) .............................. 106118980 A

(51) Int. Cl.
| | |
|---|---|
| *H01L 29/739* | (2006.01) |
| *H01L 21/768* | (2006.01) |
| *H01L 29/06* | (2006.01) |
| *H01L 21/762* | (2006.01) |

(52) U.S. Cl.
CPC ........ *H01L 29/7396* (2013.01); *H01L 21/762* (2013.01); *H01L 21/76816* (2013.01); *H01L 29/0649* (2013.01)

(58) Field of Classification Search
CPC ............. H01L 29/7396; H01L 29/0649; H01L 21/762; H01L 21/76816
See application file for complete search history.

(56) References Cited

U.S. PATENT DOCUMENTS

| | | | |
|---|---|---|---|
| 8,796,666 B1* | 8/2014 | Huang | H01L 29/66795 257/18 |
| 9,548,109 B2 | 1/2017 | Chung | |
| 2013/0277760 A1 | 10/2013 | Lu et al. | |
| 2016/0322464 A1* | 11/2016 | Meiser | H01L 29/1087 |

* cited by examiner

*Primary Examiner* — Kyoung Lee
*Assistant Examiner* — Christina A Sylvia
(74) *Attorney, Agent, or Firm* — JCIPRNET

(57) ABSTRACT

A power transistor device including a substrate structure, a first conductive layer, a second conductive layer, and a third conductive layer is provided. The substrate structure has a base portion and fin portions. The fin portions protrude from a surface of the base portion. The first conductive layer is disposed across the fin portions and has a first side and a second side opposite to each other. The second conductive layer is disposed across the fin portions and is located at the first side of the first conductive layer. The third conductive layer is disposed across the fin portions and is located at the second side of the first conductive layer. The first conductive layer, the second conductive layer, the third conductive layer, and the fin portions are insulated from each other. An extending direction of the first, second, and third conductive layers intersects a length direction of the fin portions.

8 Claims, 3 Drawing Sheets

POWER TRANSISTOR DEVICE

CROSS-REFERENCE TO RELATED APPLICATION

This application claims the priority benefit of Taiwan application serial no. 106118980, filed on Jun. 8, 2017. The entirety of the above-mentioned patent application is hereby incorporated by reference herein and made a part of this specification.

BACKGROUND OF THE INVENTION

Field of the Invention

The invention relates to a semiconductor structure and particularly relates to a power transistor device.

Description of Related Art

The power switch transistor has already been widely used in the field of power management, in which an ideal power switch should have the characteristics of low on-resistance and high breakdown voltage, so as to ensure the power conversion efficiency of the power management circuit and to provide an excellent current-handling capacity. In addition, the conventional transistor device remains unidirectionally conductive when the transistor is in a turn-off state because the conventional transistor device has a body diode. In order to enable a switch device to be in a bidirectionally turn-off state, a pair of transistors connected in series is usually required to achieve said effects. However, such a structure enhances the on-resistance of the transistor device and complicates the control thereof. In light of the above, people having ordinary skill in the art have been researching on how to reduce the on-resistance of the transistor device and enhance the bidirectional breakdown voltage thereof.

SUMMARY OF THE INVENTION

The invention provides a power transistor device having a low on-resistance (Ron) and a high bidirectional voltage withstanding capability.

The invention provides a power transistor device including a substrate structure, a first conductive layer, a second conductive layer, and a third conductive layer. The substrate structure has a base portion and fin portions. The fin portions protrude from a surface of the base portion. The first conductive layer is disposed across the fin portions and has a first side and a second side opposite to each other. The second conductive layer is disposed across the fin portions and is located at the first side of the first conductive layer. The third conductive layer is disposed across the fin portions and is located at the second side of the first conductive layer. The first conductive layer, the second conductive layer, the third conductive layer, and the fin portions are insulated from each other. An extending direction of the first conductive layer, the second conductive layer, and the third conductive layer intersects a length direction of the fin portions.

According to an embodiment of the invention, in the power transistor device, the first conductive layer, the second conductive layer, and the third conductive layer may be arranged along the length direction of the fin portions.

According to an embodiment of the invention, the power transistor device may further include a first dielectric layer, a second dielectric layer, and a third dielectric layer. The first dielectric layer is disposed between the first conductive layer and the fin portions. The second dielectric layer is disposed between the second conductive layer and the fin portions. The third dielectric layer is disposed between the third conductive layer and the fin portions.

According to an embodiment of the invention, in the power transistor device, a thickness of the first dielectric layer is less than a thickness of the second dielectric layer and less than a thickness of the third dielectric layer, for example.

According to an embodiment of the invention, the power transistor device may further include a fourth conductive layer and a fifth conductive layer. The fourth conductive layer and the fifth conductive layer are disposed on the base portion on two sides of the fin portions. The fourth conductive layer is located at the first side of the first conductive layer, and the fifth conductive layer is located at the second side of the first conductive layer.

According to an embodiment of the invention, in the power transistor device, the second conductive layer may be electrically coupled to the fifth conductive layer, and the third conductive layer may be electrically coupled to the fourth conductive layer.

According to an embodiment of the invention, in the power transistor device, a top surface of the fourth conductive layer and a top surface of the fifth conductive layer may further extend onto top surfaces of the fin portions.

According to an embodiment of the invention, the power transistor device may further include a fourth dielectric layer. The fourth dielectric layer is disposed between the first conductive layer and the second conductive layer, between the first conductive layer and the third conductive layer, between the second conductive layer and the fourth conductive layer, and between the third conductive layer and the fifth conductive layer.

According to an embodiment of the invention, in the power transistor device, a material of the fourth conductive layer and the fifth conductive layer is metal, doped polysilicon, or a combination thereof, for example.

According to an embodiment of the invention, the power transistor device may further include a fifth dielectric layer and a sixth dielectric layer. The fifth dielectric layer is disposed at a bottom portion of the fourth conductive layer. The sixth dielectric layer is disposed at a bottom portion of the fifth conductive layer.

According to an embodiment of the invention, the power transistor device may further include a first well and a second well. The first well and the second well are disposed in the substrate structure separately from each other. The first well surrounds the fourth conductive layer. The second well surrounds the fifth conductive layer.

The invention also provides another power transistor device including a substrate structure, a first spacer, a second spacer, a third spacer, and a fourth spacer. The substrate structure includes a first trench, a second trench, and third trenches. The first trench and the second trench extend along a first direction. The third trenches extend along a second direction between the first trench and the second trench. The first direction intersects the second direction. The first spacer, the second spacer, the third spacer, and the fourth spacer are disposed between the first trench and the second trench and extend along the first direction. The second spacer and the third spacer form a first space. The first spacer and the second spacer form a second space. The third spacer and the fourth spacer form a third space. A first conductive layer is disposed in the first space. A second conductive layer is disposed in the second space. A third conductive layer is disposed in the third space.

According to another embodiment of the invention, the power transistor device may further include fin portions. The fin portions are disposed between the adjacent third trenches.

According to another embodiment of the invention, the power transistor device may further include a first dielectric layer, a second dielectric layer, and a third dielectric layer. The first dielectric layer is disposed between the first conductive layer and the substrate structure. The second dielectric layer is disposed between the second conductive layer and the substrate structure. The third dielectric layer is disposed between the third conductive layer and the substrate structure.

According to another embodiment of the invention, in the power transistor device, a thickness of the first dielectric layer is less than a thickness of the second dielectric layer and less than a thickness of the third dielectric layer, for example.

According to another embodiment of the invention, in the power transistor device, the first conductive layer and the second conductive layer may be electrically insulated from each other by the second spacer, and the first conductive layer and the third conductive layer may be electrically insulated from each other by the third spacer.

According to another embodiment of the invention, the power transistor device may further include a fourth conductive layer and a fifth conductive layer. The fourth conductive layer and the fifth conductive layer are disposed in the first trench and the second trench, respectively.

According to another embodiment of the invention, in the power transistor device, the second conductive layer may be near the fourth conductive layer and electrically coupled to the fifth conductive layer. The third conductive layer may be near the fifth conductive layer and electrically coupled to the fourth conductive layer.

According to another embodiment of the invention, in the power transistor device, a dielectric layer may be respectively located at a bottom portion of the first trench and a bottom portion of the second trench.

Based on the above, in the power transistor device of the invention, the surface area of the substrate structure is enlarged because of the fin portions, so that the current channel width may be expanded effectively, and the Ron of the power transistor device may be further reduced effectively.

In addition, the second conductive layer and the third conductive layer are disposed as a shading gate on the fin portions and are respectively located at the first side and the second side of the first conductive layer, so as to assist in controlling the carrier concentration of the fin portions during operation. As such, the Ron of the power transistor device may be reduced effectively.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
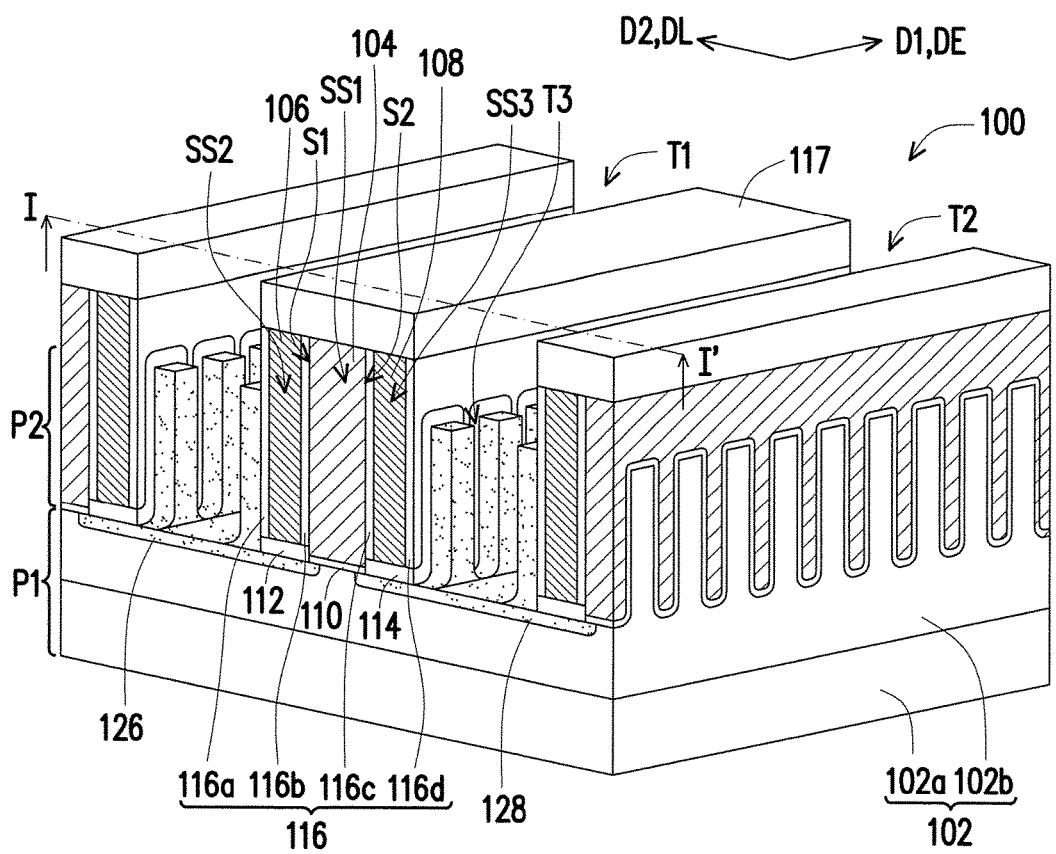
FIG. 1 is a three-dimensional view of a power transistor device according to an embodiment of the invention.
Figure 2:
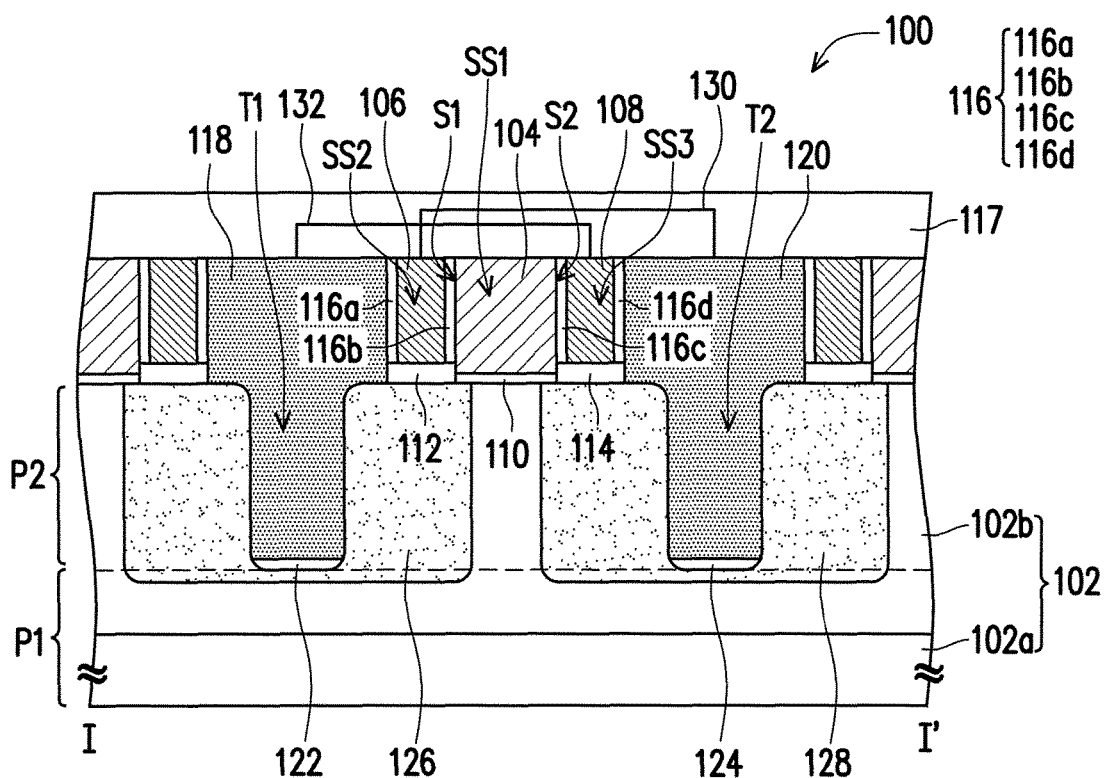
FIG. 2 is a cross-sectional view of a power transistor device sectioned along a sectional line I-I' of FIG. 1 according to an embodiment of the invention.
Figure 3:
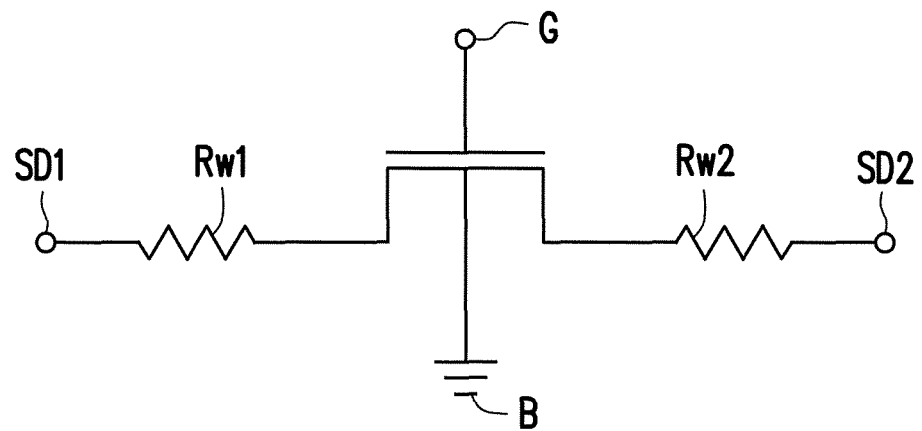
FIG. 3 is a schematic circuit diagram briefly illustrating the power transistor device of FIG. 2.
Figure 4:
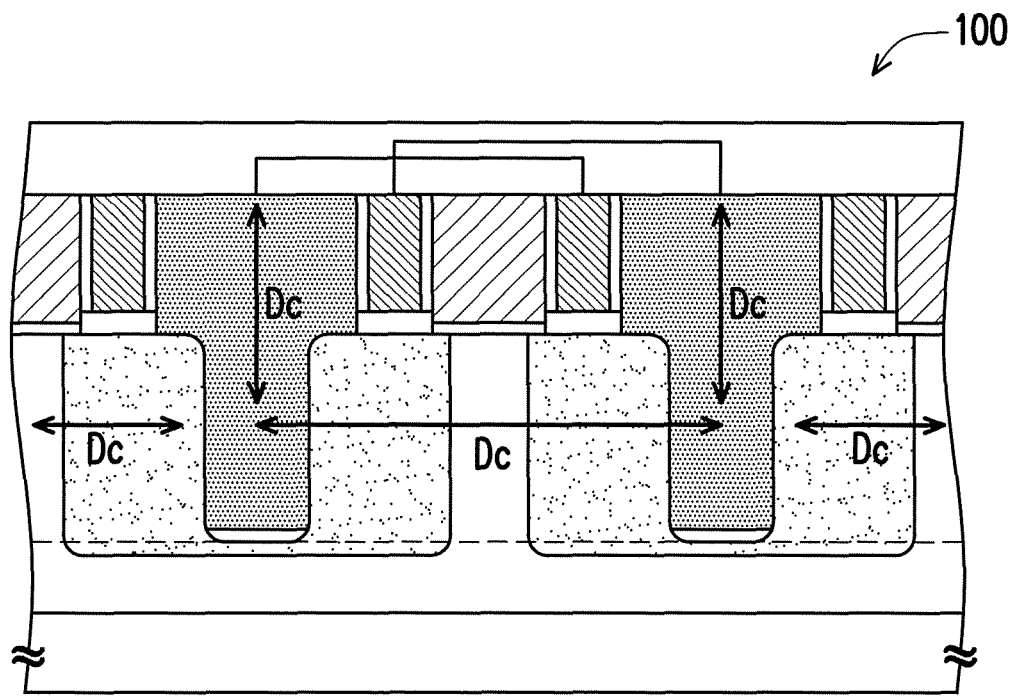
FIG. 4 is a schematic view illustrating a current direction when the power transistor device of FIG. 2 is in operation.

FIG. 1 is a three-dimensional view of a power transistor device according to an embodiment of the invention. To clearly describe the arrangement relationship of substrate structure, conductive layers, and spacers, a fourth conductive layer, a fifth conductive layer, a fifth dielectric layer, a sixth dielectric layer, and a top dielectric layer above the fourth conductive layer and fifth conductive layer depicted in FIG. 2 are omitted in FIG. 1. FIG. 2 is a cross-sectional view of a power transistor device sectioned along a sectional line I-I' of FIG. 1 according to an embodiment of the invention. FIG. 3 is a schematic circuit diagram briefly illustrating the power transistor device of FIG. 2. FIG. 4 is a schematic view illustrating a current direction when the power transistor device of FIG. 2 is in operation.

As shown in FIG. 1 and FIG. 2, a power transistor device 100 includes a substrate structure 102, a first conductive layer 104, a second conductive layer 106, and a third conductive layer 108. The power transistor device 100 may be an n-type metal-oxide-semiconductor (NMOS) transistor or a p-type metal-oxide-semiconductor (PMOS) transistor. In this embodiment, the NMOS transistor is taken as an example of the power transistor device 100.

The substrate structure 102 has a base portion P1 and fin portions P2. The fin portions P2 protrude from a surface of the base portion P1. The number of fin portions P2 may be one or more. In this embodiment, there may be plural fin portion P2, for instance. The fin portions P2 may extend along a length direction DL of the fin portions P2.

In other words, the substrate structure 102 includes a first trench T1, a second trench T2, and third trenches T3. The first trench T1 extends along a first direction D1. The second trench T2 extends along the first direction D1. The third trenches T3 extends along a second direction D2 between the first trench T1 and the second trench T2. The fin portions P2 may be disposed between adjacent third trenches T3.

The substrate structure 102 may include a substrate 102a and an epitaxial layer 102b. The substrate 102a may be a semiconductor substrate, such as a silicon substrate. The epitaxial layer 102b is disposed on the substrate 102a. The substrate 102a may be a p-type substrate or an n-type substrate, and the epitaxial layer 102b may be a p-type epitaxial layer or an n-type epitaxial layer. In this embodiment, the p-type substrate is taken as an example of the substrate 102a, and the p-type epitaxial layer is taken as an example of the epitaxial layer 102b.

The first conductive layer 104 is disposed across the fin portions P2 and has a first side S1 and a second side S2 opposite to each other. In this embodiment, the first conductive layer 104 may be a gate. When the power transistor device 100 is in operation, a voltage is applied to the first conductive layer 104, and a current flows in the fin portions P2 at this time. The operating principle of the power transistor device 100 is similar to that of a laterally diffused metal oxide semiconductor (LDMOS) transistor. Specifically, the first conductive layer 104 extends to one side surface of the fin portion P2, the top surface of the fin portion P2, and the other side surface of the fin portion P2. In addition, after crossing over one fin portion P2, the first conductive layer 104 extends onto the base portion P1 along an extending direction DE, and then the first conductive layer 104 is disposed across another fin portion P2. Besides, in other embodiments, the first conductive layer 104 may completely fill the third trenches T3 along the extending direction DE. The structure of the fin portion P2 protrudes from the surface of the base portion P1, which allows the substrate structure 102 to have a large surface area and thereby effectively expands the current channel width effectively as well as reduces the Ron of the power transistor device 100. A material of the first conductive layer 104 is metal, doped polysilicon, or a combination thereof, for example. A method for forming the first conductive layer 104 is chemical vapor deposition, for example.

The second conductive layer 106 and the third conductive layer 108 are respectively disposed across the fin portions P2 and are respectively located at the first side S1 of the first conductive layer 104 and the second side S2 of the first conductive layer 104. Thereby, the second conductive layer 106 and the third conductive layer 108 may serve as a shading gate for reducing the Ron of the power transistor device 100 effectively. Specifically, the second conductive layer 106 and the third conductive layer 108 extend to one side surface of the fin portion P2, the top surface of the fin portion P2, and the other side surface of the fin portion P2. In other words, after crossing over one fin portion P2, the second conductive layer 106 and the third conductive layer 108 may extend onto the base portion P1 along the extending direction DE, then the second conductive layer 106 and the third conductive layer 108 are disposed across another fin portion P2. In addition, the second conductive layer 106 and the third conductive layer 108 may completely fill the third trenches T3 along the extending direction DE. A material of the second conductive layer 106 and the third conductive layer 108 is metal, doped polysilicon, or a combination thereof, for example. A method for forming the second conductive layer 106 and the third conductive layer 108 is chemical vapor deposition, for example.

Besides, the first conductive layer 104, the second conductive layer 106, the third conductive layer 108, and the fin portions P2 are insulated from each other. The extending direction DE of the first conductive layer 104, the second conductive layer 106, and the third conductive layer 108 intersects the length direction DL of the fin portions P2, for example. For instance, the extending direction DE may be perpendicular to the length direction DL. The first conductive layer 104, the second conductive layer 106, and the third conductive layer 108 may be arranged along the length direction DL of the fin portions P2. The extending direction DE of the first conductive layer 104, the second conductive layer 106, and the third conductive layer 108 may be the same as the first direction D1. The length direction DL of the fin portions P2 may be the same as the second direction D2.

In addition, the power transistor device 100 may further include a first dielectric layer 110, a second dielectric layer 112, a third dielectric layer 114, a fourth dielectric layer 116, a fourth conductive layer 118, a fifth conductive layer 120, a fifth dielectric layer 122, a sixth dielectric layer 124, a first well 126, a second well 128, and a top dielectric layer 117.

The first dielectric layer 110 is disposed between the first conductive layer 104 and the fin portions P2 of the substrate structure 102, such that the first conductive layer 104 and the fin portions P2 are insulated from each other. The second dielectric layer 112 is disposed between the second conductive layer 106 and the fin portions P2 of the substrate structure 102, such that the second conductive layer 106 and the fin portions P2 are insulated from each other. The third dielectric layer 114 is disposed between the third conductive layer 108 and the fin portions P2 of the substrate structure 102, such that the third conductive layer 108 and the fin portions P2 are insulated from each other. A material of the first dielectric layer 110, the second dielectric layer 112, and the third dielectric layer 114 is, for example, oxide (e.g., silicon oxide), and the first dielectric layer 110, the second dielectric layer 112, and the third dielectric layer 114 may be formed by lithography, wet oxidation, or chemical vapor deposition.

In addition, the first dielectric layer 110, the second dielectric layer 112, and the third dielectric layer 114 may have the same thickness or different thicknesses. In this embodiment, the first dielectric layer 110 has the thickness less than the thickness of the second dielectric layer 112 and less than the thickness of the third dielectric layer 114, for example, whereby the breakdown voltage of the power transistor device 100 may be increased.

The fourth dielectric layer 116 may serve as a spacer. The fourth dielectric layer 116 is disposed respectively between the first conductive layer 104 and the second conductive layer 106 and between the first conductive layer 104 and the third conductive layer 108, such that the first conductive layer 104 and the second conductive layer 106 are insulated from one another, and the first conductive layer 104 and the third conductive layer 108 are insulated from one another. A material of the fourth dielectric layer 116 is, for example, oxide (e.g., silicon oxide). The fourth dielectric layer 116 may be formed by lithography, wet oxidation, or chemical vapor deposition.

For instance, the fourth dielectric layer 116 may include a first spacer 116a, a second spacer 116b, a third spacer 116c, and a fourth spacer 116d. The first spacer 116a, the second spacer 116b, the third spacer 116c, and the fourth spacer 116d are located between the first trench T1 and the second trench T2 and extend along the first direction D1. The second spacer 116b and the third spacer 116c fourth a first space SS1. The first spacer 116a and the second spacer 116b form a second space SS2. The third spacer 116c and the fourth spacer 116d form a third space SS3. The first conductive layer 104 is disposed in the first space SS1. The second conductive layer 106 is disposed in the second space SS2. The third conductive layer 108 is disposed in the third space SS3. In an embodiment, the first conductive layer 104, the second conductive layer 106, and the third conductive layer 108 may completely fill the first space SS1, the second space SS2, and the third space SS3, respectively. The first conductive layer 104 and the second conductive layer 106 may be electrically insulated from each other by the second spacer 116b, and the first conductive layer 104 and the third conductive layer 108 may be electrically insulated from each other by the third spacer 116c.

In addition, the first dielectric layer 110, the second dielectric layer 112, the third dielectric layer 114, and the fourth dielectric layer 116 may be independent components or may be integrally formed. In other words, the first dielectric layer 110, the second dielectric layer 112, the third dielectric layer 114, and the fourth dielectric layer 116 may be respectively formed by different processes or simultaneously formed by the same process.

The top dielectric layer 117 may cover the top surfaces of the first conductive layer 104, the second conductive layer 106, the third conductive layer 108, the fourth conductive layer 118, and the fifth conductive layer 120. A material of the top dielectric layer 117 is, for example, oxide (e.g., silicon oxide), and the top dielectric layer 117 may be formed by chemical vapor deposition.

The fourth conductive layer 118 and the fifth conductive layer 120 are disposed on the base portion P1 on two sides of the fin portions P2 and may respectively serve as a source or a drain of the power transistor device 100. The fourth conductive layer 118 is located at the first side S1 of the first conductive layer 104, and the fifth conductive layer 120 is located at the second side S2 of the first conductive layer 104. For instance, the fourth conductive layer 118 may be disposed in the first trench T1 of the substrate structure 102, and the fifth conductive layer 120 may be disposed in the second trench T2 of the substrate structure 102, so as to provide a bidirectionally conductive power transistor device. A material of the fourth conductive layer 118 and the fifth conductive layer 120 is metal, doped polysilicon, or a combination thereof, for example. A method for forming the fourth conductive layer 118 and the fifth conductive layer 120 is physical vapor deposition or chemical vapor deposition, for example. The top surface of the fourth conductive layer 118 and the top surface of the fifth conductive layer 120 may be higher than the top surfaces of the fin portions P2.

In addition, the second conductive layer 106 may be near the fourth conductive layer 118 and may be electrically coupled to the fifth conductive layer 120. The third conductive layer 108 may be near the fifth conductive layer 120 and may be electrically coupled to the fourth conductive layer 118. Thereby, the Ron of the power transistor device 100 may be reduced effectively, and the power transistor device 100 may have an improved bidirectional voltage withstanding capability. For instance, the second conductive layer 106 may be electrically coupled to the fifth conductive layer 120 through an interconnect structure 130 in the top dielectric layer 117, and the third conductive layer 108 may be electrically coupled to the fourth conductive layer 118 through an interconnect structure 132 in the top dielectric layer 117. The interconnect structure 130 and the interconnect structure 132 may respectively include a contact, a via, a conductive wire, or a combination thereof. The top surface of the fourth conductive layer 118 and the top surface of the fifth conductive layer 120 may further extend onto the top surfaces of the fin portions P2. In this embodiment, the top surface of the fourth conductive layer 118 and the top surface of the fifth conductive layer 120 may be higher than the top surfaces of the fin portions P2. On said conditions, the fourth dielectric layer 116 may be further disposed between the second conductive layer 106 and the fourth conductive layer 118 and between the third conductive layer 108 and the fifth conductive layer 120, such that the second conductive layer 106 and the fourth conductive layer 118 are insulated from each other, and that the third conductive layer 108 and the fifth conductive layer 120 are insulated from each other.

The fifth dielectric layer 122 and the sixth dielectric layer 124 are disposed respectively at a bottom portion of the fourth conductive layer 118 and on a bottom portion of the fifth conductive layer 120. In other words, the fifth dielectric layer 122 and the sixth dielectric layer 124 may be respectively located at a bottom portion of the first trench T1 and a bottom portion of the second trench T2, so as to increase the breakdown voltage of the power transistor device 100. A material of the fifth dielectric layer 122 and the sixth dielectric layer 124 is, for example, oxide (e.g., silicon oxide), and the fifth dielectric layer 122 and the sixth dielectric layer 124 may be formed by wet oxidation or chemical vapor deposition.

The first well 126 and the second well 128 are disposed in the substrate structure 102 separately from each other. The first well 126 surrounds the fourth conductive layer 118. The second well 128 surrounds the fifth conductive layer 120. A method for forming the first well 126 and the second well 128 is ion implantation, for example. The first well 126 and the second well 128 may be n-type wells or p-type wells. In this embodiment, the n-type wells are taken as an example of the first well 126 and the second well 128.

Please refer to FIG. 2 and FIG. 3. FIG. 3 is a schematic circuit diagram briefly illustrating the power transistor device 100. According to FIG. 3, the power transistor device 100 is a bidirectional transistor device, wherein a gate G may correspond to the first conductive layer 104, a source/drain SD1 and a source/drain SD2 may correspond to the fourth conductive layer 118 and the fifth conductive layer 120, a body B may correspond to the substrate structure 102, and a resistance Rw1 and a resistance Rw2 may respectively represent the resistance of the first well 126 and the resistance of the second well 128.

In addition, referring to FIG. 2 to FIG. 4, since the power transistor device 100 is a bidirectional transistor device, when the power transistor device 100 is in operation, i.e., when a voltage is applied to the first conductive layer 104 (the gate G), the carrier concentration of the fin portions P2 increases, such that the first well 126 and the second well 128 are electrically coupled, and that the current flows along a current direction Dc.

In the power transistor device 100, the fin portions P2 defined by the first trench T1, the second trench T2, and the third trenches T3 may effectively enlarge the surface area of the substrate structure 102, so as to expand the current channel width for the current flowing in the substrate structure 102, and the Ron of the power transistor device 100 may be further reduced effectively. In addition, the second conductive layer 106 and the third conductive layer 108 are disposed on the fin portions P2 and are respectively located at the first side S1 of the first conductive layer 104 and the second side S2 of the first conductive layer 104, so as to further control the carrier concentration of the fin portions P2 when the power transistor device 100 is in operation. Hence, the Ron of the power transistor device 100 may be reduced more effectively, and the power transistor device 100 having good bidirectional voltage withstanding capability may be provided.

Furthermore, since the second conductive layer 106 may be electrically coupled to the fifth conductive layer 120 through the interconnect structure 130 in the top dielectric layer 117, and the third conductive layer 108 may be electrically coupled to the fourth conductive layer 118 through the interconnect structure 132 in the top dielectric layer 117, the voltage withstanding capability of the power transistor device 100 is increased when the power transistor device 100 is in operation. For instance, during the operation of the power transistor device 100, when the current direction Dc is from the fourth conductive layer 118 to the fifth conductive layer 120, an external voltage (not illustrated) is applied to the fourth conductive layer 118 and the third conductive layer 108, and the second well 128 in the fin portions P2 has a carrier concentration higher than the carrier concentration of the first well 126 in the fin portions P2. At this time, if the power transistor device 100 is an open circuit, the carriers of the second well 128 are attracted by the third conductive layer 108. Thereby, the distance between the first well 126 and the second well 128 increases, the breakdown voltage of the power transistor device 100 increases, and vice versa.

To sum up, in the power transistor device described in the above embodiments, the first conductive layer, the second conductive layer, and the third conductive layer are disposed on the fin portions and insulated from one another. As such, the Ron of the power transistor device may be reduced effectively, and the bidirectional voltage withstanding capability of the power transistor device may be enhanced effectively.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A power transistor device, comprising:
    a substrate structure, comprising:
        a first trench, extending along a first direction;
        a second trench, extending along the first direction; and
        third trenches, extending along a second direction between the first trench and the second trench, wherein the first direction intersects the second direction; and
    a first spacer, a second spacer, a third spacer, and a fourth spacer, disposed between the first trench and the second trench and extending along the first direction, wherein the second spacer and the third spacer form a first space, the first spacer and the second spacer form a second space, the third spacer and the fourth spacer form a third space, a first conductive layer is disposed in the first space, a second conductive layer is disposed in the second space, and a third conductive layer is disposed in the third space.

2. The power transistor device according to claim 1, further comprising fin portions disposed between adjacent third trenches of the third trenches.

3. The power transistor device according to claim 1, further comprising:
    a first dielectric layer, disposed between the first conductive layer and the substrate structure;
    a second dielectric layer, disposed between the second conductive layer and the substrate structure; and
    a third dielectric layer, disposed between the third conductive layer and the substrate structure.

4. The power transistor device according to claim 3, wherein the first dielectric layer has a thickness less than a thickness of the second dielectric layer and less than a thickness of the third dielectric layer.

5. The power transistor device according to claim 1, wherein the first conductive layer and the second conductive layer are electrically insulated from each other by the second spacer, and the first conductive layer and the third conductive layer are electrically insulated from each other by the third spacer.

6. The power transistor device according to claim 1, further comprising a fourth conductive layer and a fifth conductive layer, wherein the fourth conductive layer and the fifth conductive layer are disposed respectively in the first trench and the second trench.

7. The power transistor device according to claim 6, wherein
    the second conductive layer is near the fourth conductive layer and is electrically coupled to the fifth conductive layer, and
    the third conductive layer is near the fifth conductive layer and is electrically coupled to the fourth conductive layer.

8. The power transistor device according to claim 1, wherein a dielectric layer is respectively located at a bottom portion of the first trench and a bottom portion of the second trench.

* * * * *